United States Patent
Neelakantan et al.

(10) Patent No.: US 9,703,056 B2
(45) Date of Patent: Jul. 11, 2017

(54) COPPER TUBE INTERCONNECT

(71) Applicant: Freescale Semiconductor, Inc., Austin, TX (US)

(72) Inventors: Sriram Neelakantan, Austin, TX (US); Trent S. Uehling, New Braunfels, TX (US)

(73) Assignee: NXP USA, INC., Austin, TX (US)

( * ) Notice: Subject to any disclaimer, the term of this patent is extended or adjusted under 35 U.S.C. 154(b) by 254 days.

(21) Appl. No.: 14/162,367

(22) Filed: Jan. 23, 2014

(65) Prior Publication Data

US 2015/0205041 A1    Jul. 23, 2015

(51) Int. Cl.
*G02B 6/12* (2006.01)
*G02B 6/42* (2006.01)
*G02B 6/43* (2006.01)
*H01L 27/146* (2006.01)

(52) U.S. Cl.
CPC ........... *G02B 6/428* (2013.01); *G02B 6/42* (2013.01); *G02B 6/43* (2013.01); *H01L 27/14629* (2013.01); *H01L 27/14634* (2013.01); *H01L 27/14636* (2013.01); *H01L 27/14685* (2013.01); *H01L 27/14687* (2013.01); *H01L 27/14689* (2013.01); *G02B 6/4202* (2013.01); *G02B 6/4214* (2013.01)

(58) Field of Classification Search
None
See application file for complete search history.

(56) References Cited

U.S. PATENT DOCUMENTS

| | | | |
|---|---|---|---|
| 5,047,364 A | 9/1991 | Hattori | |
| 6,330,377 B1 * | 12/2001 | Kosemura | G02B 6/42 385/14 |
| 7,654,753 B2 * | 2/2010 | Sheau Tung Wong | G02B 6/4206 257/100 |
| 8,456,018 B2 * | 6/2013 | Park | H01L 24/19 257/774 |
| 2005/0087747 A1 * | 4/2005 | Yamada | G02B 6/43 257/80 |
| 2010/0244053 A1 | 9/2010 | Dai et al. | |

* cited by examiner

*Primary Examiner* — Ryan Lepisto
*Assistant Examiner* — Erin Chiem (57) ABSTRACT

A method and apparatus are provided for fabricating an electro-optical interconnect on an integrated circuit (101, 114) in which an optical circuit element (102) is formed by forming a cylinder-shaped conductive interconnect structure (120, 122, 126, 128) with one or more conductive layers formed around a central opening (129) which is located over an optically transparent layer (118) located over the optical circuit element (102).

11 Claims, 8 Drawing Sheets

COPPER TUBE INTERCONNECT

BACKGROUND OF THE INVENTION

Field of the Invention

The present invention is directed in general to semiconductor devices and methods for manufacturing same. In one aspect, the present invention relates to the fabrication of semiconductor devices or integrated circuits with optical and electrical interconnect circuits and devices.

Description of the Related Art in information systems, data signal information is communicated between devices and circuits using different types of signal connections. With electrical conductor-based connections, such as conventional wires or through silicon vias (TSVs), there are power and bandwidth constraints imposed by the power requirements, minimum device footprint requirements, and physical limitations of such conductor-based connections. For example, stacked die modules have been proposed to provide high density information systems, but the power consumption and associated heat dissipation requirements for communicating data signals between stacked die modules using conductor-based connections can limit the achievable density. In addition, the bandwidth of such stacked die modules is limited by the number and inductance of TSVs and other conductor-based connections for such die stacks. To overcome such limitations, optical interconnect and communication systems have been developed as a way of communicating at higher bandwidths with reduced power. With such optical systems, a monochromatic, directional, and coherent laser light beam is modulated to encode information for transfer to other devices or circuits of the system, typically by transferring modulated light signals along an optical fiber or waveguide path. However, there are a number of challenges with using optical waveguides to replace electrical interconnects for transferring information between different integrated circuit (IC) chips in a system in terms of cost, complexity, and control requirements. These challenges arise from the tight alignment tolerances required to meet information transmission requirements and other use factors that can disrupt alignment during device operation. Attempts have been made to overcome or reduce the challenges of using optical interconnects by using massive parallel interconnect systems which have separate electrical and optical interconnects to transfer electrical and optical information to or from an integrated circuit (IC) chip or system. Unfortunately, such massive parallel interconnect systems can require a large amount of die area and power, and as a result, the existing solutions for providing speed interconnects between multiple semiconductor die without increasing power requirements or die size is extremely difficult at a practical level.

BRIEF DESCRIPTION OF THE DRAWINGS

The present invention may be understood, and its numerous objects, features and advantages obtained, when the following detailed description is considered in conjunction with the following drawings, in which.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for fabricating conductive tube interconnect structures that may be at least partially filled with an optical conducting medium or air gap for use in transferring data and/or power between multiple die or between a die and package substrate using electrical and optical signals conveyed through the conductive tube interconnect structures. In selected embodiments, each conductive tube interconnect structure is formed by electroplating or otherwise depositing copper, aluminum, or other suitable electrically conductive materials to fill at least part of a tube mold structure formed over an optical component in the integrated circuit die or wafer, thereby forming an electrically conductive cylindrical interconnect structure. In addition, at least part of each conductive tube interconnect structure may be filled with an optically transparent medium, such as glass, optically clear epoxies, air, or any suitable optical material, thereby forming an optical interconnect structure for conveying an optical signal to or from any optical components formed in the die, such as a photodiode, photo-resistor, Vertical Cavity Surface Emitting Lasers (VCSEL), laser-diode, quantum dot, or the like. In selected embodiments, a glass fiber may be formed in the conductive tube interconnect structure for conveying an optical signal to or from any optical components formed in the die. With the disclosed conductive tube interconnect structures, the optically transparent opaque interior of each conductive tube interconnect structure may be used to transmit and/or receive optical signal information, while the electrically conductive cylindrical interconnect structure is used to provide electrical conductors for signal and/or power connections. To establish electrical and optical connection between two die (or between a die and a package substrate), a first conductive tube interconnect structure formed over an optical component in a first die is positioned and attached to a second conductive tube interconnect structure formed over an optical component in a second die or package substrate. The aligned conductive tube interconnect structures may be attached using any desired technique, such as solder reflow, thermal compression bonding, electrically conductive adhesives, or any desired electrical attachment technique for electrically connecting the first and second conductive tube interconnect structures.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified perspective and cross sectional drawings of a semiconductor device without including every device feature or geometry in order to avoid limiting or obscuring the present invention. In addition, it is noted that, throughout this detailed description, certain materials will be formed and removed to fabricate the integrated circuits with conductive tube interconnect structures. Where the specific procedures for forming or removing such materials are not detailed below, conventional techniques to one skilled in the art for growing, depositing, removing or otherwise forming such layers at appropriate thicknesses shall be intended. Such descriptions and representations are used by those skilled in the art to describe and convey the substance of their work to others skilled in the art, and the omitted details which are well known are not considered necessary to teach one skilled in the art of how to make or use the present invention.

Figure 1A:
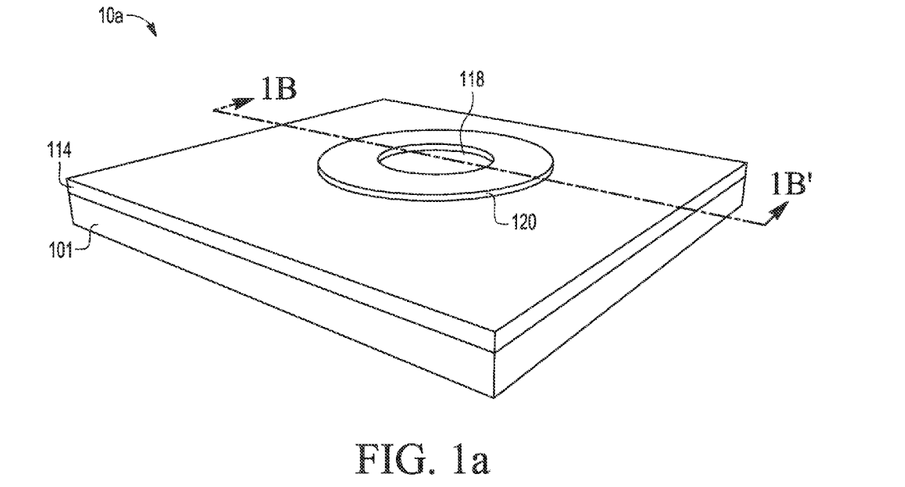
FIGS. 1a and 1b illustrate partial perspective and cross-sectional views of a semiconductor wafer or die structure including an electrical connection bond pad formed over an optical component in accordance with selected embodiments of the present disclosure.

Turning now to FIG. 1a, there is shown a simplified perspective view 10a of part of a semiconductor wafer or die structure 101 which includes an electrical connection bond pad 120 formed on one or more interconnect layers 114 and over an optical waveguide component 118 in accordance with selected embodiments of the present disclosure. As illustrated, the electrical connection bond pad 120 may be formed to have a cylindrical shape which is centered and aligned over an optical waveguide component 118, though any desired shape may be used which provides an opening over the optical waveguide component 118 formed in the semiconductor wafer or die structure 101 and/or interconnect layer(s) 114. The electrical connection bond pad 120 may also be formed with any electrically conductive material or combination of materials, including but not limited to copper, aluminum, or even a barrier metal or diffusion layer, such as cobalt, ruthenium, tantalum, tantalum nitride, indium oxide, tungsten nitride, titanium nitride, nickel, nichrome, hafnium, niobium, zirconium, vanadium, tungsten, and copper silicide. In addition, any desired fabrication technique may be used to form the electrical connection bond pad 120, including selective deposition of a conductive material or patterning and etching a blanket-deposited conductive material using an etch mask (e.g., patterned photoresist) and appropriate etch technique. Though not shown, it will be appreciated that the electrical connection bond pad 120 is electrically connected to one or more circuits formed in the semiconductor wafer or die structure 101.

Figure 1B:
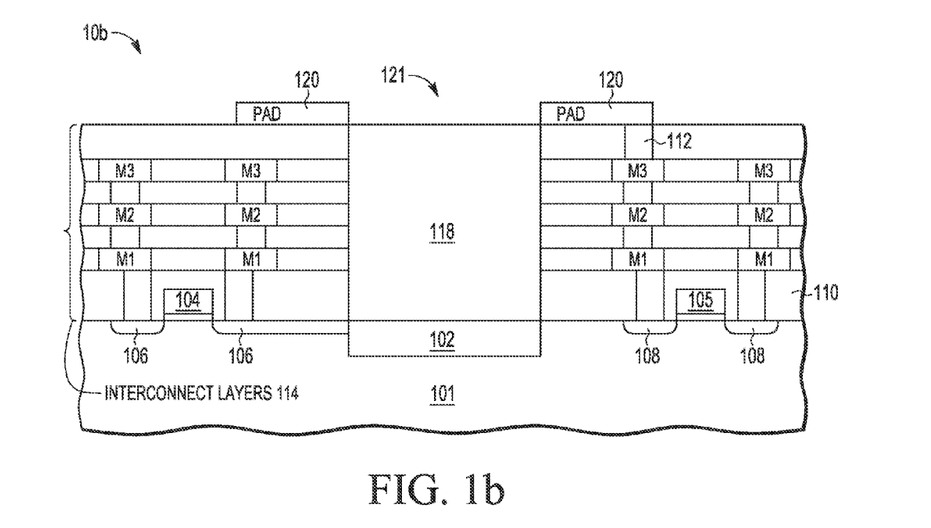

To illustrate additional details for selected embodiments of the present disclosure, reference is now made to FIG. 1b which illustrates a simplified partial cross-sectional view 10b of the electrical connection bond pad 120 shown in FIG. 1a taken along view line 1B-1B'. As illustrated, the bond pad 120 is formed on a multi-level interconnect structure 114 which covers a substrate 101, and includes an opening 121 which exposes the optical waveguide component 118 formed over the optical component 102. Though shown as being located under the optical waveguide 118, it will be appreciated that the optical component 102 may be located elsewhere, such as being laterally displaced from the optical waveguide 118 and electrical connection bond pad 120 in cases where waveguide conduct the optical signal both laterally and vertically through the interconnect structure. The structural details of the interconnect structure 114 and substrate 101 are not important, though in selected embodiments, the substrate 101 includes a semiconductor body or well layer formed with an appropriate semiconductor material (for example, monocrystalline or polycrystalline silicon) having a first polarity type (for example, p-type silicon), such as a bulk semiconductor substrate, semiconductor-on-insulator (SOI) substrate, or a polysilicon layer. In addition, the interconnect structure 114 may include multiple patterned or damascene metal layers and vias formed in a plurality of interlevel dielectric (ILD) layers to provide electrical connections to circuits formed in the substrate 101. As formed, the electrical connection bond pad 120 has an opening 121 centered over an optical waveguide component 118 and associated optical component 102 formed in the integrated circuit die or wafer 101. Formed with a material having suitable optical transparency (e.g., tetraethyl orthosilicate (TEOS), silica glass, acrylic, unfilled epoxy, or other optically clear materials), the optical waveguide component 118 is a physical structure that guides electromagnetic waves to and from the optical component 102 in a signal transmission path through the opening 121 in the pad 120. Though shown in simplified form, the optical component 102 may be a photo-detector element (such as a quantum dot, self-electro-optic effect device (SEED), or other optical transmitter circuit) a photo-emitter element (such as a quantum dot, VCSEL) or other optical component circuit, such as a photo-diode, photo-resistor, laser-diode, or the like. The optical component 102 is shown as being connected to transistors formed in the substrate 101. For example, a first transistor on the left includes agate electrode stack 104 with adjacent source and drain regions 106 connected to the optical component 102, where the first transistor may be connected through one or more via contacts or metal line conductors M1, M2, M3 formed in the multi-level interconnect structure 114 to other electrical circuitry in the substrate 101. In this configuration, the first transistor may be used to control the optical component 102. In addition, a second transistor on the right includes a gate electrode stack 105 with adjacent source and drain regions 108 which are connected through one or more via contacts or metal line conductors M1, M2, M3 (including via contact 112) formed in the multi-level interconnect structure 114 to the electrical connection bond pad formed 120 and to other electrical circuitry in the substrate 101. In this configuration, the second transistor may be used to control the connection of electrical signals to or from the bond pad 120.

Figure 2:
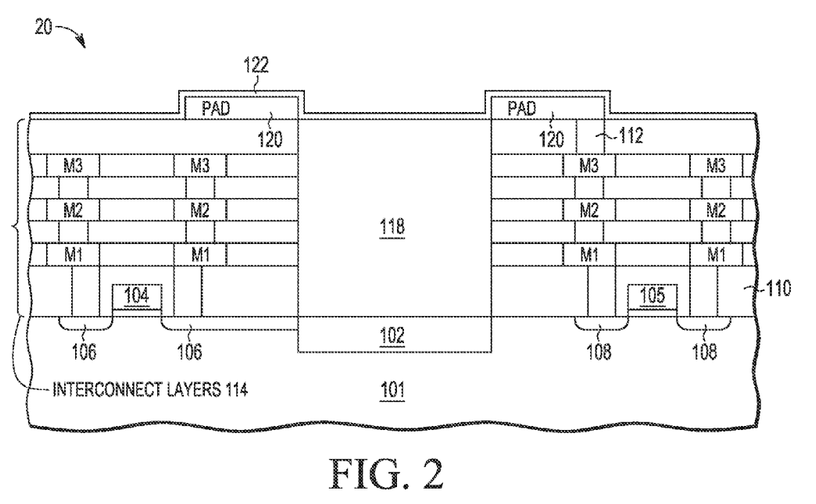
FIG. 2 illustrates processing of the semiconductor wafer or die structure subsequent to FIG. 1b after a seed and/or barrier layer is formed over the wafer/die structure.

FIG. 2 illustrates processing of the semiconductor wafer or die structure subsequent to FIG. 1*b* with a simplified partial cross-sectional view 20 after a seed and/or barrier layer 122 is formed over the entire wafer/die/interconnect structure and electrical connection bond pad 120. By way of providing a non-limiting example of processing steps that may be used, a first barrier or diffusion layer 122 may be formed by blanket depositing a first conformal liner layer of a metal barrier material or combination of materials (e.g., cobalt, ruthenium, tantalum, tantalum nitride, indium oxide, tungsten nitride, and titanium nitride, nickel, nichrome, hafnium, niobium, zirconium, vanadium, tungsten, indium oxide, copper silicide, titanium tungsten or titanium nitride) by using chemical vapor deposition (CVD), plasma-enhanced chemical vapor deposition (PECVD), physical vapor deposition (PVD), atomic layer deposition (ALD), molecular beam deposition (MBD), or any combination(s) thereof to a thickness of approximately 100-3000 Angstroms (e.g., 1500 Angstroms), though other materials and thicknesses may be used. As formed, the barrier liner layer conformally covers the interconnect structure 114 and the top and sides of the electrical connection bond pad 120. On the barrier liner layer 122, one or more seed layers (not shown) of conductive metal material (e.g., copper) may be formed using CVD, PECVD, PVD, ALD, MBD, or any combination (s) thereof to a predetermined thickness in the range of 200-5000 Angstroms (e.g., 2000-3000 Angstroms).

Figure 3:
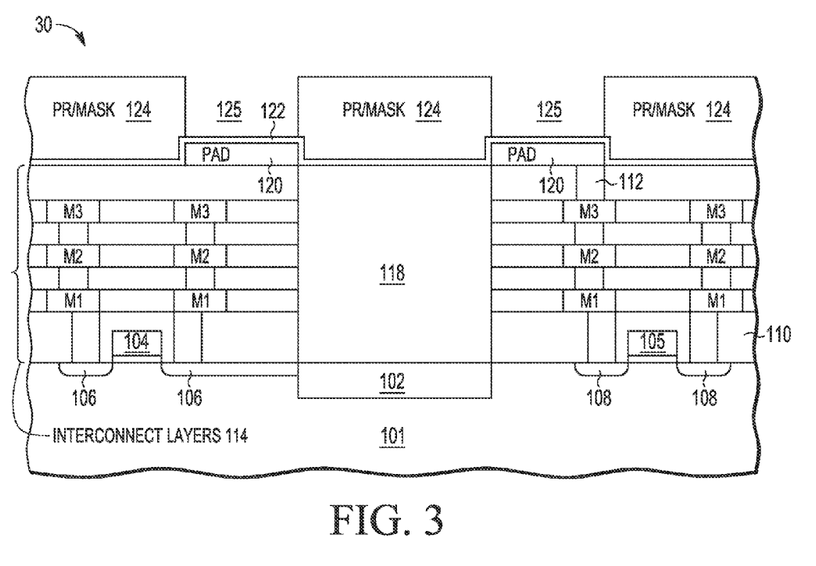
FIG. 3 illustrates processing of the semiconductor wafer or die structure subsequent to FIG. 2 after a patterned photoresist or mask layer is formed over the wafer/die structure.

FIG. 3 illustrates processing of the semiconductor wafer or die structure subsequent to FIG. 2 with a simplified partial cross-sectional view 30 after a patterned photoresist or mask layer 124 is formed over the wafer/die structure 101, 114 with openings formed over the electrical connection bond pad 120 but otherwise covering the interconnect structure 114 and pad opening 121. While any desired mask and/or pattern steps may be used, in a selected illustrative embodiment, a photoresist coating layer 121 with a predetermined thickness range of 1-100 um (e.g., approximately 10 um) may be applied over the entire wafer/die/interconnect structure 101, 114, exposed, and developed to form a patterned photoresist layer 124 with openings 125 defined therein to expose the seed and/or barrier layer 122 formed on the electrical connection bond pad 120, but to otherwise cover and protect the wafer/die structure 101, 114. With the defined openings 125 forming a cylindrical or tube-shaped opening over the bond pad 120, the patterned photoresist or mask layer 124 forms an infill mask or mold structure in which a conductive tube interconnect structure may be formed as described hereinbelow.

Figure 4:
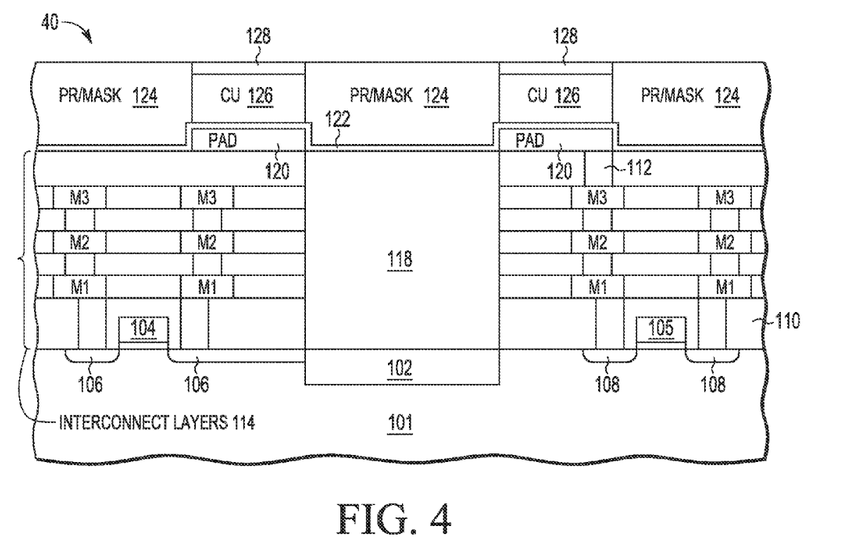
FIG. 4 illustrates processing of the semiconductor wafer or die structure subsequent to FIG. 3 after forming a copper tube over the wafer/die structure.

FIG. 4 illustrates processing of the semiconductor wafer or die structure subsequent to FIG. 3 with a simplified partial cross-sectional view 40 after a conductive tube interconnect structure 126, 128 is formed in the patterned photoresist or mask layer 124 and over the wafer/die structure 101, 114. By way of providing a non-limiting example of processing steps that may be used, one or more metal-based layers 126 of suitable conductor material (e.g., copper) are deposited to all or part of the opening(s) 125 in the patterned photoresist or mask layer 124 using CVD, PECVD, sputtering, PVD, electro-plating, electro-less plating, or the like. For example, using the thin seed and/or barrier layer 122 as a seed layer, the copper tube structure 126 may be formed by electroplating copper to partially fill the openings 125 in the patterned mask layer 124. Subsequently, an additional conductive metal material or sacrificial material 128 may be formed over the copper tube structure 126 to fill the openings 125 in the patterned mask layer 124. In selected embodiments, the additional conductive metal material or sacrificial material 128 may be formed as a protective layer (e.g., an organic surface protectant, immersion silver, immersion tin, electroless nickel with immersion gold coating, direct gold plating over nickel, etc.) to help protect the surface of the copper tube structure 126 from oxidation. When formed with a non-conductive organic surface protectant material, such as a chemical compound based on imidazole or triazole compound, the sacrificial layer 128 decomposes and off-gasses during the reflow process. In addition or in the alternative, the additional conductive metal material 128 may be formed with a fusible metal alloy material (e.g., solder) that is subsequently used to electro-mechanically attached the conductive tube interconnect structure 126, 128 to another conductive tube interconnect structure. In selected embodiments, the additional conductive metal material 128 may be formed by electroplating solder on the copper tube structure 126 to fill the openings 125 in the patterned mask layer 124. If desired, a planarization process (e.g., chemical mechanical polish) may be applied to planarize the additional conductive metal material 128 to form a planarized conductive tube interconnect structure 126, 128 in the patterned photoresist or mask layer 124.

Figure 5:
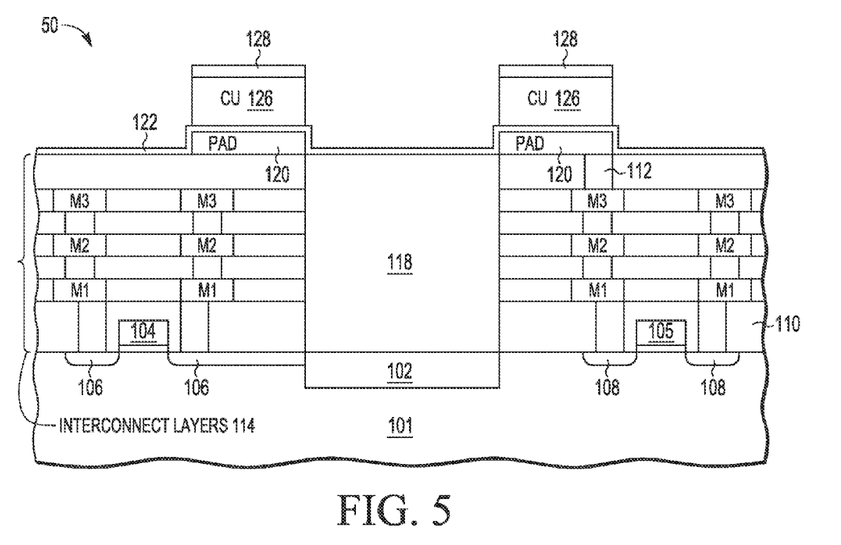
FIG. 5 illustrates processing of the semiconductor wafer or die structure subsequent to FIG. 4 after removing the patterned photoresist or mask layer.

FIG. 5 illustrates processing of the semiconductor wafer or die structure subsequent to FIG. 4 with a simplified partial cross-sectional view 50 after removing the patterned photoresist or mask layer 124. Depending on what materials are used to form the resist/mask layer 124, one or more appropriate etch processes may be applied to selectively remove the resist/mask layer 124 while leaving the conductive tube interconnect structure 126, 128 and seed and/or barrier layer 122 in place. For example, a patterned photoresist layer 124 may be stripped with an ash/piranha process, though other resist removal processes may be used.

Figure 6A:
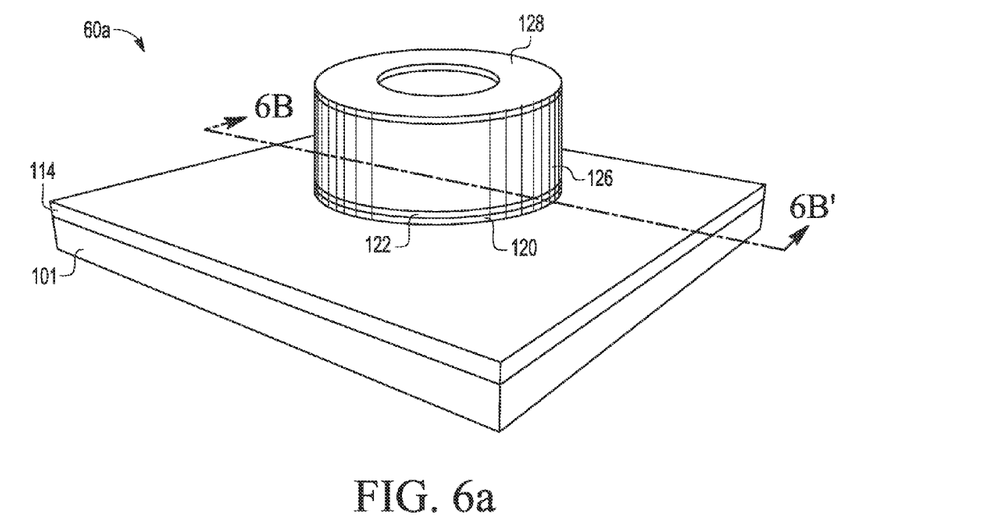
FIGS. 6a and 6b illustrate partial perspective and cross-sectional views of the semiconductor wafer or die structure subsequent to FIG. 5 after removing exposed portions of the seed and/or barrier layer to form a combined electrical and optical copper tube interconnect structure.

Turning now to FIG. 6*a*, there is shown a simplified perspective view 60*a* to illustrate processing of the semiconductor wafer or die structure subsequent to FIG. 5 after removing exposed portions of the seed and/or barrier layer 122 to form a copper tube interconnect structure 126, 128 for conveying electrical and optical signal information to and from electro-optical circuit components formed in the substrate 101. As illustrated, the removal of the patterned mask/resist layer 124 exposes portions of the seed and/or barrier layer 122 formed on the interconnect structure 114 that are not covered by the conductive tube interconnect structure 126, 128. When the patterned mask/resist layer 124 is removed or stripped, the underlying barrier and/or seed layers 122 may also be selectively removed, such as by applying one or more wet etch processes that are selective to the materials used to form the interconnect structure 114 and the conductive tube interconnect structure 126, 128.

Figure 6B:
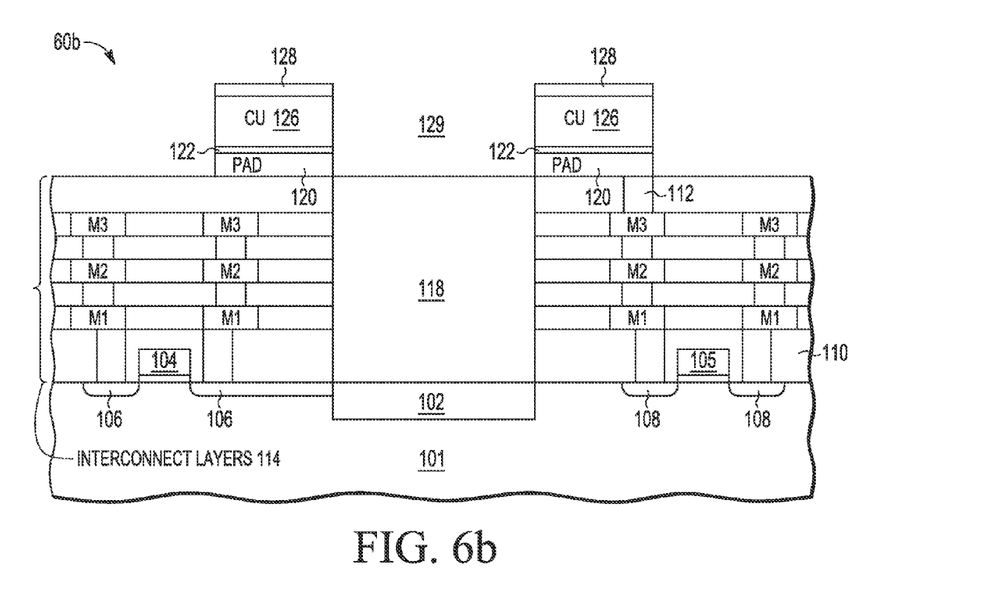

To illustrate additional details for selected embodiments of the present disclosure, reference is now made to FIG. 6*b* which illustrates a simplified partial cross-sectional view 60*b* of the copper tube interconnect structure 126, 128 formed on the electrical connection bond pad 120 shown in FIG. 6*a* taken along view line 6B-6B'. As illustrated, the copper tube interconnect structure 126, 128 and bond pad 120 are formed with an opening 129 which exposes the optical waveguide component 118 formed over the optical component 102 formed in the integrated circuit die or wafer 101. The resulting copper tube interconnect structure 126, 128 includes an opening 129 that is directly optically connected through the optical waveguide component 118 to the optical component 102, and in turn to associated electro-optical circuitry through one or more first transistors 104, 106. In addition, the copper tube interconnect structure 126, 128 is directly electrically connected to the bond pad 120 and associated electrical circuitry through one or more second transistors 105, 108.

Figure 7:
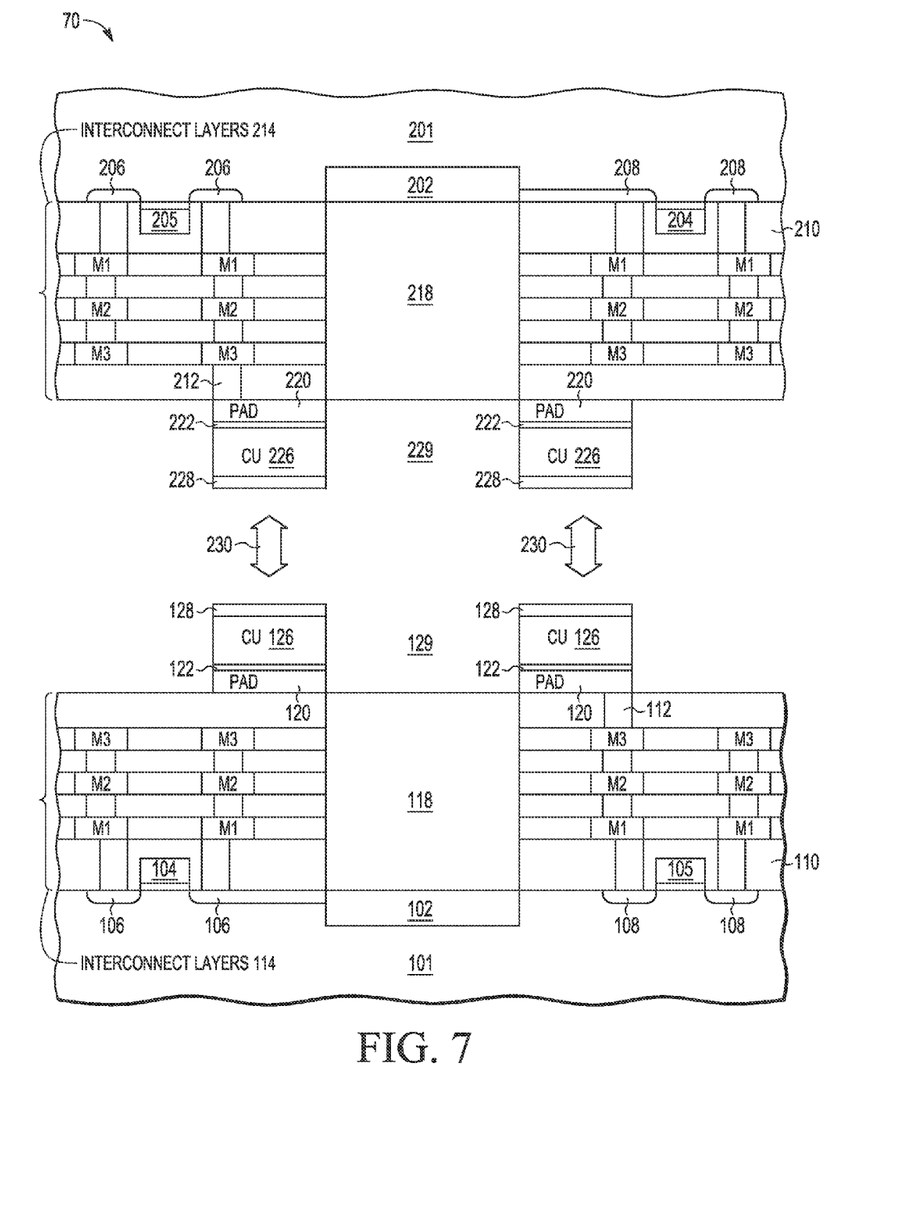
FIGS. 7-8 illustrate the placement and attachment of two die having aligned combined electrical and optical copper tube interconnect structures to provide an electro-optical interconnect between the two die.

To illustrate selected embodiments for placing and attaching two die having aligned copper tube interconnect structures to provide a combined electro-optical interconnect between the two die, reference is now made to FIG. 7 which illustrates a simplified partial cross-sectional view 70 of the semiconductor wafer or die structure of FIG. 6b which is positioned for alignment with a second semiconductor wafer or die structure 201 and interconnect structure 214. As illustrated, the second semiconductor wafer or die structure 201 includes one or more electrical connection transistors 205, 206 and optical connection transistors 204, 208 which are formed and connected through patterned or damascene metal layers and vias formed in a plurality of interlevel dielectric (ILD) layers 214 to a conductive tube interconnect structure 226, 228 formed on an electrical connection bond pad 220 with an opening 229 that is directly optically connected through the optical waveguide component 218 to the optical component 202 formed in the substrate 201. Without belaboring the structural or processing details concerning the formation of the second semiconductor wafer or die structure and conductive tube interconnect structure 226, 228 formed thereon, it will be appreciated that, in selected embodiments, the same fabrication processes may be used as described hereinabove with reference to FIGS. 1-6, as indicated by the use of corresponding reference numbers shifted from the 100-series to the 200-series reference numbers. However, it will also be appreciated from the illustration in FIG. 7 that the thicknesses and/or materials used for the fabrication of the second semiconductor wafer or die structure and conductive tube interconnect structure 226, 228 may be adjusted or changed. For example, the height of the copper tube structure 226 is shown as being smaller than the height of the copper tube structure 126, though different relative heights could be used. As illustrated by the alignment arrows 230, the first and second semiconductor wafer/die structures are positioned for alignment of the conductive tube interconnect structure 126/128, 226/228 formed thereon. As will be appreciated, the positioning of the second semiconductor wafer/die structure over the first semiconductor wafer/die structure may be done by using backside alignment marks (not shown) formed on the substrates 101, 201 to guide the movement and alignment of the semiconductor wafer/die structures.

Figure 8:
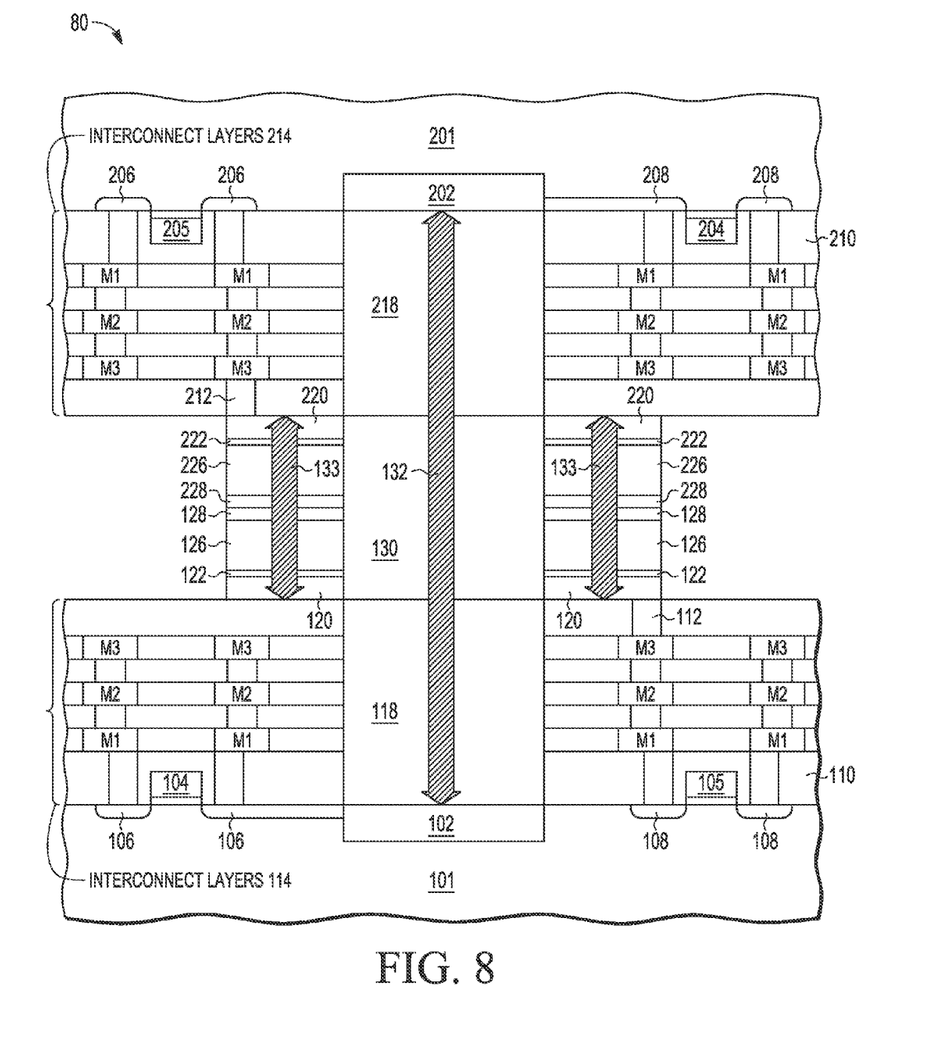

FIG. 8 illustrates processing subsequent to FIG. 7 with a simplified partial cross-sectional view 80 after the two semiconductor wafer/die structures have been bonded together using the conductive metal bonding layers 128, 228 formed on the distal ends of the conductive tube interconnect structure 126/128, 226/228. In preparation for bonding, the semiconductor wafer/die structures may each be cleaned, such as by using a non-oxidizing ash chemistry or solvent-based wet removal process which does not oxidize the conductive tube interconnect structure 126/128, 226/228. In selected embodiments, the conductive tube interconnect structure 126/128, 226/228 are bonded together using metal compression bonding techniques, such as a combination of thermal and pressure bonding. For example, when the conductive metal bonding layers 128, 228 are formed with a solder-type material, the conductive tube interconnect structure 126/128, 226/228 are bonded together using thermocompression bonding whereby the conductive metal bonding layers 128, 228 are aligned in contact while heat and compression is applied to bond them to one another. As will be appreciated, thermocompression bonding may be implemented by applying pressure at or above a predetermined threshold (e.g., 3 MPa) in combination with a relatively low temperature heat process (e.g., at or below 500 degrees Celsius). In other selected embodiments, the conductive tube interconnect structures 126/128, 226/228 are bonded together using a solder reflow process where the aligned semiconductor wafer/die structures are placed together in a furnace to reflow the conductive solder bonding layers 128, 228. Other bonding methods may be used, such as thermal diffusion, conductive epoxy bonding, or the like.

As a result of attaching the aligned conductive tube interconnect structures 126/128, 226/228 together, a shared electrical and optical interconnect is formed between the semiconductor wafer/die structures. In the center of the bonded conductive tube interconnect structures 126/128, 226/228, an optical transmit/receive signal path 132 is formed between the aligned optical components 102, 202. As illustrated, the optical signal path 132 may extend from the optical component 102 in the first semiconductor wafer/die structure, through the optical conducting medium of the optical waveguide component 118 and through the air gap 130 to the optical conducting medium of the optical waveguide component 218 formed in the second semiconductor wafer/die structure where it reaches the aligned optical component 202 formed therein. Alternatively, a glass fiber structure or other optically conductive material may be used to provide an optical transmit/receive signal path between the aligned optical components 102, 202. However formed, the optical transmit/receive signal path 132 allows a direct optical link to be established between the circuitry in the semiconductor wafer/die structures. Once attached, point-to-point optical communications can be used to communicate between the die in the stacked die assembly. For example, circuitry formed in the first semiconductor wafer/die structure (e.g., transistor 104, 106) may communicate with circuitry formed in the second semiconductor wafer/die structure (e.g., transistor 204, 208) using point-to-point optical beam signals 132. As will be appreciated, the stacked die can be implemented with other configurations in other embodiments, such as non-aligned orientations or angled optical transmit/receive signal paths.

In addition to providing an optical signal path 132, the bonded conductive tube interconnect structures 126/128, 226/228 also form a direct electrical signal or voltage path 133 between the bonded semiconductor wafer/die structures. In particular, the electrically conductive tube interconnect structures 126/128, 226/228 form electrical conductors for signal and/or power connections between electronic circuitry formed on the substrates 101, 201. In this way, circuitry formed in the first semiconductor wafer/die structure (e.g., transistor 105, 108) may communicate with circuitry formed in the second semiconductor wafer/die structure (e.g., transistor 205, 206) using the electrical signal path formed by the bonded conductive tube interconnect structures 120/122/126/128, 220/222/226/228.

Figure 9:
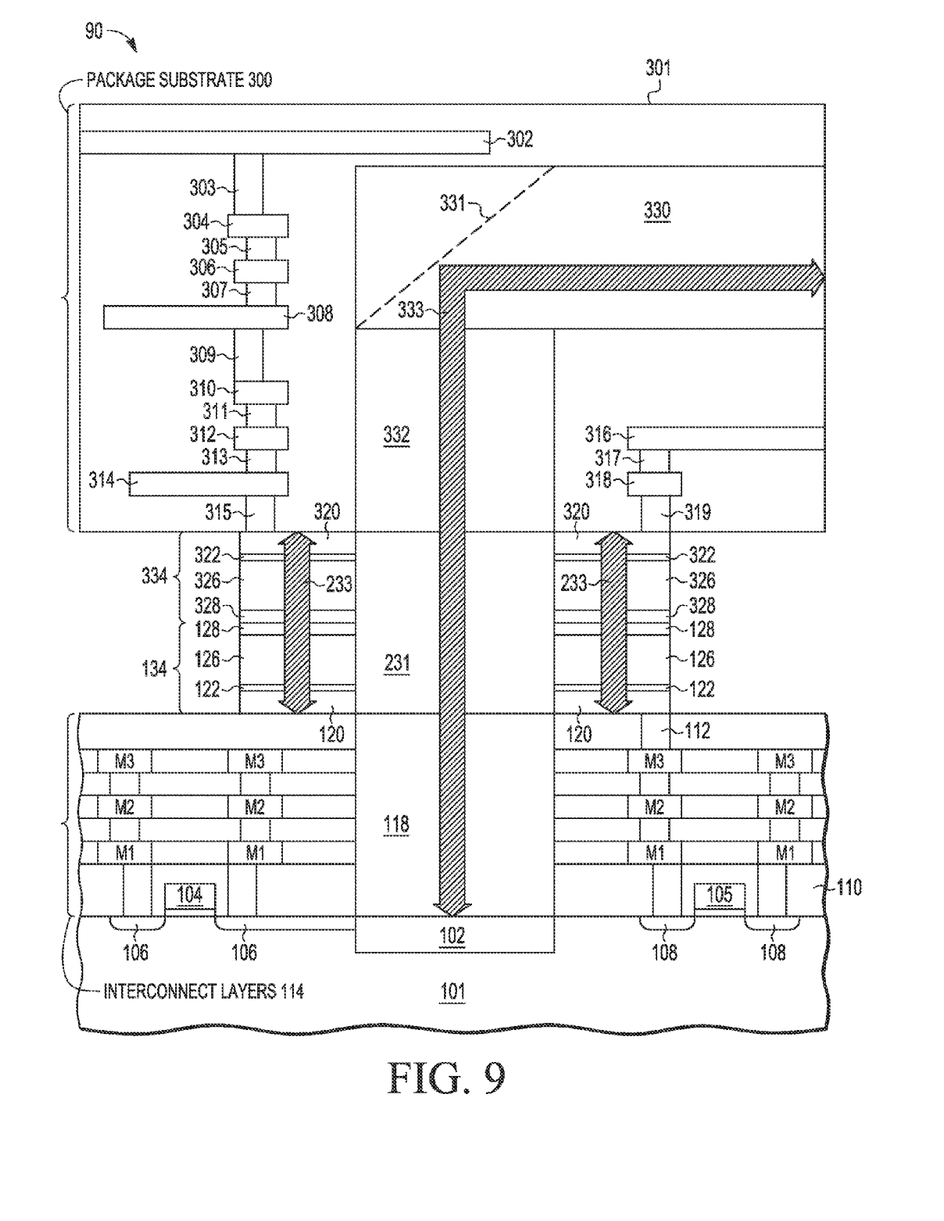
FIG. 9 illustrates the placement and attachment of a die and package substrate having aligned combined electrical and optical copper tube interconnect structures to provide an electro-optical interconnect between the die and package substrate.

In addition to forming shared electrical and optical interconnect between two stacked die, selected embodiments of the present invention may also be deployed to form a shared electrical and optical interconnect between a die and an attached package substrate. For example, FIG. 9 illustrates a simplified partial cross-sectional view 90 of the semiconductor wafer or die structure of FIG. 6b which is attached to a package substrate structure 300 having aligned combined electrical and optical copper tube interconnect structures 134, 334 to provide an electro-optical interconnect between the die and package substrate. As illustrated, the package substrate structure 300 may be a multi-layer substrate or interposer structure 301 formed with multiple ceramic or plastic layers in which one or more electrical conductor layers 302-319 and optical signal waveguide structures 330-332 for convening signal or power to or from the mounted die. For example, an optical waveguide path 333 may be formed in the package substrate structure 300 with one or more suitably optically transparent materials 330, 332, alone or in combination with a deflection mirror structure 331 for perpendicularly deflecting an optical signal transmitted down the optical signal path 333. Similar to the function of the optical waveguide component 118, the optical waveguide component 332 may be formed with a material having suitable optical transparency (e.g., TEOS, silica glass, acrylic, unfilled epoxy, or other optically clear materials) to provide a physical structure that guides electromagnetic waves down the optical waveguide path 333 and through the opening 231 formed at the surface of the package substrate structure 300. In addition, electrically conductive paths may be formed in the package substrate structure 300 with patterned or damascene metal layers and vias 302-315, 316-319 for conducting electrical signals or power to or from an electrical connection bond pad 320 formed on the package substrate 300 around the opening 231. On the electrical connection bond pad 320, a conductive interconnect tube or cylinder structure 334 is formed around the opening 231 that is directly optically connected to the optical waveguide path 333 formed in the package substrate structure 300. Without belaboring the structural or processing details concerning the formation of the conductive interconnect tube or cylinder structure 334, it will be appreciated that, in selected embodiments, the fabrication processes similar to those described hereinabove with reference to FIGS. 1-6 may be used to fabricate a cylindrical conductive interconnect tube structure 334 in a copper tube mold (e.g., formed with patterned photoresist) by electroplating one or more layers of copper 326 and solder 328 to be directly electrically connected to the electrical connection bond pad 320 formed on the substrate 300 and around the opening 231. Of course, it will be appreciated that the thicknesses and/or materials used for the constituent layers of the cylindrical conductive interconnect tube structure 334 may be adjusted or changed.

As illustrated in FIG. 9, the cylindrical conductive interconnect tube structure 334 is aligned for attachment to the copper tube interconnect structures 134 formed on the semiconductor wafer or die structure 101, 114 with the constituent layers 120, 122, 126, 128 formed thereon. In attaching the copper tube interconnect structures 134, 334, the conductive metal bonding layers 128, 328 formed on the distal ends of the conductive tube interconnect structures 134, 334 may be bonded together using any desired bonding reflow or thermal compression bonding techniques, such as described herein. As a result of attaching the aligned conductive tube interconnect structures 134, 334 together, a shared electrical and optical interconnect is formed between the semiconductor wafer/die structure and package substrate 300. In the center of the bonded conductive tube interconnect structures 134, 334, an optical transmit/receive signal path 333 is formed in alignment with the optical component 102. As illustrated, the optical signal path 333 may extend from the optical component 102 in the first semiconductor wafer/die structure, through the optical conducting medium of the optical waveguide component 118 and through the air gap 231 to the optical conducting medium of the optical signal waveguide structures 330-332 formed in the package substrate structure 300. Alternatively, a glass fiber structure or other optically conductive material may be used to provide the optical transmit/receive signal path 333 through the package substrate structure 300. However formed, the optical transmit/receive signal path 333 allows a direct optical link to be established between the circuitry in the semiconductor wafer/die structure 101, 114 and package substrate structure 300 so that circuitry formed in the first semiconductor wafer/die structure (e.g., transistor 104, 106) may use the optical component 102 to establish an optical communication signal path 333 through the package substrate structure 300. In addition to providing an optical signal path 333, the bonded conductive tube interconnect structures 134, 334 also form a direct electrical signal or voltage path 233 between the bonded semiconductor wafer/die structure 101, 114 and package substrate structure 300. In particular, the electrically conductive tube interconnect structures 134, 334 form electrical conductors for signal and/or power connections to or from electronic circuitry formed on the substrates 101 that may be routed through the conductor paths 302-315, 316-319 formed in the package substrate 300. In this way, circuitry formed in the first semiconductor wafer/die structure (e.g., transistor 105, 108) may communicate with conductor paths 302-315, 316-319 formed in the package substrate 300 using the electrical signal path formed by the bonded conductive tube interconnect structures 120/122/126/128, 320/322/326/328.

Figure 10:
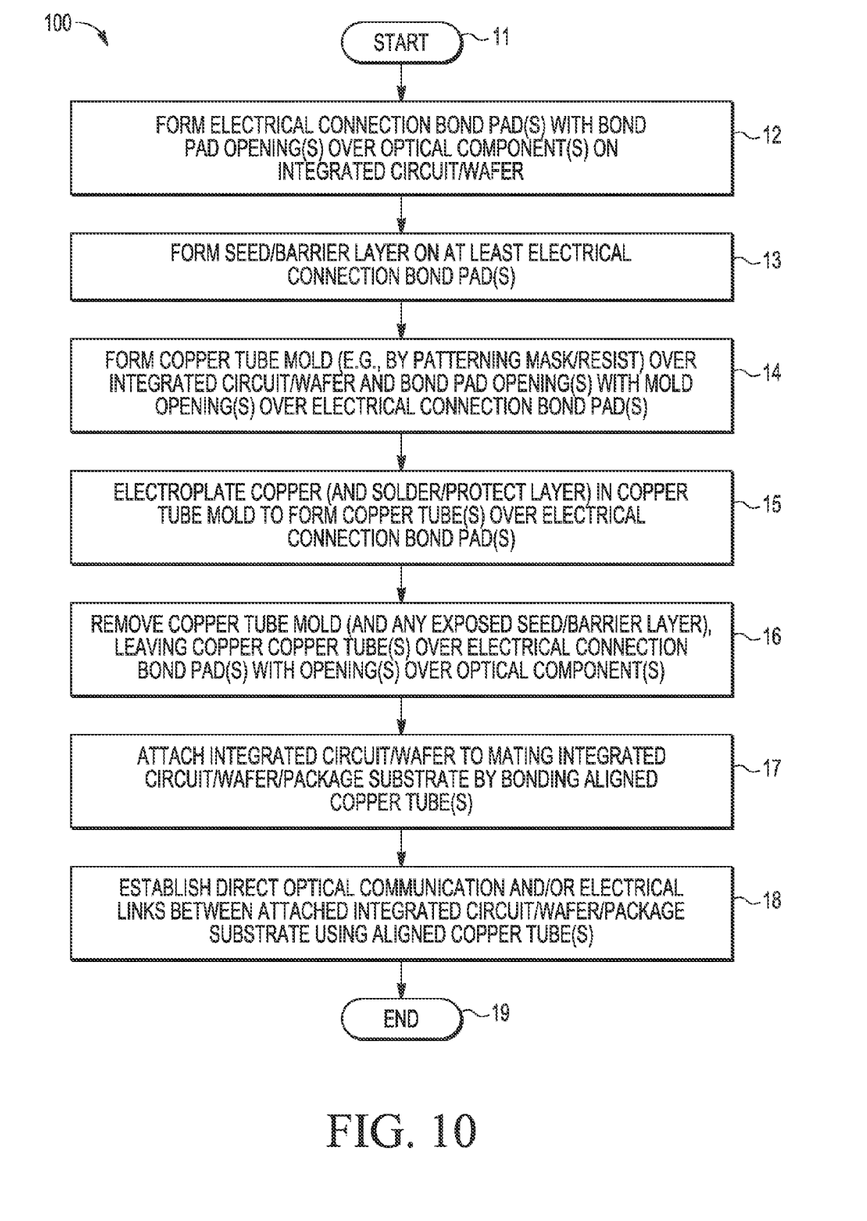
FIG. 10 illustrates a simplified flow chart of a method for fabricating a die having one or more combined electrical and optical copper tube interconnect structures.

Turning now to FIG. 10, there is shown a simplified flow chart of a method 100 for fabricating and using a die having one or more copper tube interconnect structures for providing combined electrical and optical signal paths. After the fabrication process starts (step 11), one or more electrical connection bond pads are formed on the integrated circuit or wafer structure at step 12. As formed, the electrical connection bond pads include bond pad openings that are located over or aligned with optical components or circuits formed in the integrated circuit/wafer structure. In selected embodiments, the electrical connection bond pads may formed with patterned aluminum, copper or other conductive pad materials using any desired photolithographic or damascene formation technique.

After forming the electrical connection bond pads, one or more barrier and/or seed layers are formed to cover the integrated circuit/wafer structure at step 13. In selected embodiments, one or more barrier layers may be conformally deposited by blanket sputtering a suitable barrier layer (e.g., Ti, TiW), followed by sputtering a thin copper layer as the seed layer.

On the seed/barrier layers, a copper tube mold structure may be formed at step 14. In selected embodiments, the copper tube mold structure may be formed by patterning a mask and/or photoresist layer formed on the integrated circuit/wafer structure so that mold openings are formed over the electrical connection bond pads, while the remainder of the integrated circuit/wafer structure, including the bond pad openings, are covered by the copper tube mold structure.

Once in place, one or more suitable conductive materials are formed in the mold openings of the copper tube mold structure at step 15. In selected embodiments, electroplated copper may be used to fill part of the mold openings, alone or in combination with a protective cover layer (e.g., electroplated solder) to cover the electroplated copper. At step 16, the copper tube mold structure is removed (e.g., by stripping the patterned photoresist layer), and any exposed seed/barrier layer(s) are selectively removed. These steps form copper tubes over the electrical connection bond pads with aligned openings over the optical components.

After fabrication of the copper tubes over the optical components in the integrated circuit/wafer structure, the copper tubes on the integrated circuit/wafer structure may be bonded to aligned copper tubes on another integrated circuit/wafer structure or package substrate at step 17. In selected embodiments, the bonding of aligned copper tubes may be performed using any desired bonding reflow or thermal compression bonding techniques to form a shared electrical and optical interconnect structure.

Using the shared electrical and optical interconnect structure formed by the aligned and bonded copper tubes, direct optical communication links and electrical links may be established between the attached integrated circuit/wafer structures and/or package substrate at step 18. At step 19, the process ends.

By now it should be appreciated that there is provided herein an electro-optical interconnect apparatus and associated method for fabricating same. In the disclosed fabrication methodology, a first substrate is provided (e.g., as a wafer) in which an optical circuit element (e.g., a photo-emitter circuit or photo-detector circuit) is formed. In selected embodiments, the optical circuit element may be a photo-diode, photo-resistor, Vertical Cavity Surface Emitting Lasers (VCSEL), laser-diode, quantum dot, or self-electro-optic effect device (SEED). On the first substrate, an interconnect structure is formed which has one or more metallic conductor layers formed in one or more interlevel dielectric layers and which also has an optically transparent layer located over the optical circuit element. In selected embodiments, the interconnect structure is formed with metallic conductor layers in a plurality of interlevel dielectric layers to define the electrical signal path between the first cylinder-shaped conductive interconnect structure and the one or more circuits formed in the first substrate. In addition, the optically transparent layer in the interconnect structure may be formed with a layer of tetraethyl orthosilicate (TEOS), silica glass, acrylic, unfilled epoxy, or other optically clear material located over the optical circuit element. On the interconnect structure, a first cylinder-shaped conductive interconnect structure is formed with one or more conductive layers formed around a central opening which is located over the optically transparent layer. In selected embodiments, the first cylinder-shaped conductive interconnect structure is formed by forming a disk-shaped electrical contact pad layer on the interconnect structure having a central opening located over the optically transparent layer and the optical circuit element, such as by depositing and patterning an aluminum-based layer, depositing a barrier layer comprising titanium over the aluminum-based layer, and depositing a seed layer comprising copper over the barrier layer. After forming the disk-shaped electrical contact pad layer, a mold structure is formed that has one or more mold openings which expose the disk-shaped electrical contact pad layer but otherwise covers the interconnect structure and the central opening of the disk-shaped electrical contact pad layer. To form the mold structure, a photoresist layer may be patterned and developed to define the one or more mold openings. After forming the mold structure, the mold opening(s) are filled with one or more conductive materials to form the first cylinder-shaped conductive interconnect structure in direct contact with the disk-shaped electrical contact pad layer, such as by electroplating copper to partially fill the one or more mold openings, and electroplating solder to form a bonding layer on top of the copper formed in the one or more mold openings. As formed, the first cylinder-shaped conductive interconnect structure is electrically connected to one or more circuits formed in the first substrate to provide an electrical signal path. In addition, the central opening in the first cylinder-shaped conductive interconnect structure and optically transparent layer are optically connected to the optical circuit element formed in the first substrate to provide an optical signal path. In addition, a second substrate may be provided on which is formed a second cylinder-shaped conductive interconnect structure. By positioning the first and second substrates so that the first and second cylinder-shaped conductive interconnect structures are aligned for attachment, the first and second cylinder-shaped conductive interconnect structures may be bonded together using metal thermocompression bonding or solder reflow bonding, where the first and second cylinder-shaped conductive interconnect structures are electrically connected to the electrical signal path, and where the first and second cylinder-shaped conductive interconnect structures each comprise a central opening which is optically connected to the optical signal path.

In another form, there is provided a method of forming an electro-optical interconnect. In the disclosed methodology, a first die is provided that has a semiconductor substrate in which electrical circuitry is formed, a first multi-layered interconnect structure formed over the semiconductor substrate, and a first conductive tube interconnect (e.g., a copper tube interconnect) extending from the multi-layered interconnect structure which has conductive tube sidewalls electrically connected through a bond pad to the electrical circuitry and which is at least partially filled with a first optical waveguide structure. The first die may include an optical circuit element formed in the semiconductor substrate to be in optical communication with the shared electro-optical interconnect structure. In addition, a substrate structure is provided that has a second multi-layered interconnect structure and a second conductive tube interconnect (e.g., a copper tube interconnect) extending from the second multi-layered interconnect structure which has conductive tube sidewalls electrically connected to conductors formed in the second multi-layered interconnect structure and which is at least partially filled with a second optical waveguide structure. In selected embodiments, the substrate structure is a package substrate, and in other embodiments, the substrate structure includes a second die having a second semiconductor substrate in which electrical circuitry is formed and covered by the second multi-layered interconnect structure, where the conductive tube sidewalls of the second conductive tube interconnect are electrically connected through a second bond pad formed on the second multi-layered interconnect structure to the electrical circuitry formed in the second semiconductor substrate. By aligning the first die and substrate structure for attachment in a stack, the first conductive tube interconnect may be bonded to the second conductive tube interconnect to form a shared electro-optical interconnect structure between the first die and substrate structure. In selected embodiments, the first conductive tube interconnect is bonded to the second conductive tube interconnect by thermocompression bonding a first conductive metal bonding layer formed at a distal end of the first conductive tube interconnect to a second conductive metal bonding layer formed at a distal end of the second conductive tube interconnect by applying heat and pressure. In addition, the first and second optical waveguide structures may be aligned in the first and second first conductive tube interconnects to form an optical waveguide path between the first die and substrate structure.

In yet another form, there is provided an apparatus and associated method of manufacture. In the disclosed apparatus, first and second die are attached in a die stack. Each die is covered by an interconnect stack which includes a copper tube interconnect structure which has copper tube sidewalls electrically connected to electrical conductors formed in the interconnect stack and which is at least partially filled with an optical waveguide structure. In the apparatus, a thermo-compression bond attaches the copper tube interconnect structures to form a shared electro-optical interconnect structure between the first and second die.

Although the described exemplary embodiments disclosed herein are directed to various copper tube interconnect structures for use in stacked die arrangements, the present invention is not necessarily limited to the example embodiments which illustrate inventive aspects of the present invention that are applicable to a wide variety of integrated circuit fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, the conductive tube interconnect structures are described as being formed with copper sidewalls having solder bonding layers used for attachment to another conductive tube interconnect structure, but other conductive and/or bonding materials may be used, and the processing steps (such as any seed or barrier layers used with copper) associated with copper sidewall formation may adjusted or eliminated as appropriate when other conductive materials are used. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. In addition, the term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for fabricating an electro-optical interconnect comprising:
    providing a first substrate in which an optical circuit element is formed;
    forming an interconnect structure on the first substrate comprising one or more metallic conductor layers formed in one or more interlevel dielectric layers and an optically transparent layer located over the optical circuit element; and
    forming a first conductive interconnect structure on the interconnect structure with one or more conductive layers formed around a central opening in the first conductive interconnect structure which is located over the optically transparent layer, where the first conductive interconnect structure is electrically connected to one or more circuits formed in the first substrate to provide an electrical signal path, and where the central opening in the first conductive interconnect structure and optically transparent layer are optically coupled to the optical circuit element formed in the first substrate to provide an optical signal path;
    where forming the first conductive interconnect structure comprises:
        forming an electrical contact pad layer on the interconnect structure having a central opening located over the optically transparent layer and the optical circuit element;
        forming a mold structure having one or more mold openings which expose the electrical contact pad layer but otherwise covering the interconnect structure and the central opening of the electrical contact pad layer; and
        filling the one or more mold openings with one or more conductive materials to form the first conductive interconnect structure in direct contact with the electrical contact pad layer.

2. The method of claim 1, where the optical circuit element formed in the first substrate comprises photo-emitter circuit or photo-detector circuit.

3. The method of claim 1, where the optical circuit element formed in the first substrate comprises photo-diode, photo-resistor, Vertical Cavity Surface Emitting Lasers (VCSEL), laser-diode, quantum dot, or self-electro-optic effect device (SEED).

4. The method of claim 1, where forming the interconnect structure comprises forming metallic conductor layers in a plurality of interlevel dielectric layers to define the electrical signal path between the first conductive interconnect structure and the one or more circuits formed in the first substrate.

5. The method of claim 1, where forming the interconnect structure comprises forming the optically transparent layer as a layer of tetraethyl orthosilicate (TEOS), silica glass, acrylic, unfilled epoxy, or other optically clear material located over the optical circuit element.

6. The method of claim 1, where forming the electrical contact pad layer comprises depositing and patterning an aluminum-based layer.

7. The method of claim 6, further comprising:
    depositing a barrier layer comprising titanium over the aluminum-based layer; and,
    depositing a seed layer comprising copper over the barrier layer.

8. The method of claim 1, where forming the mold structure comprises patterning and developing a photoresist layer to define the one or more mold openings.

9. The method of claim 1, where filling the one or more mold openings comprises:
   electroplating copper to partially fill the one or more mold openings; and
   electroplating solder to form a bonding layer on top of the copper formed in the one or more mold openings.

10. The method of claim 1, further comprising:
    providing a second substrate on which a second conductive interconnect structure is formed;
    positioning the first and second substrates so that the first and second conductive interconnect structures are aligned for attachment;
    bonding the first and second conductive interconnect structures together, where the first and second conductive interconnect structures are electrically connected to the electrical signal path, and where the first and second conductive interconnect structures each comprise a central opening which is optically coupled to the optical signal path.

11. The method of claim 10, where the second substrate comprises an optical circuit element positioned to be in optical communication with the first and second conductive interconnect structures that are bonded together.

\* \* \* \* \*